(12) United States Patent
Derderian et al.

(10) Patent No.: US 6,458,416 B1
(45) Date of Patent: Oct. 1, 2002

(54) DEPOSITION METHODS

(75) Inventors: Garo J. Derderian; Gurtej S. Sandhu, both of Boise, ID (US)

(73) Assignee: Micron Technology, Inc., Boise, ID (US)

( * ) Notice: Subject to any disclaimer, the term of this patent is extended or adjusted under 35 U.S.C. 154(b) by 20 days.

(21) Appl. No.: 09/619,449

(22) Filed: Jul. 19, 2000

(51) Int. Cl.$^7$ ............................. B05D 1/36; B05D 3/00; B05D 5/12
(52) U.S. Cl. ....................... 427/301; 427/58; 427/402; 427/258
(58) Field of Search ................. 427/58, 301, 402, 427/258, 248.1, 255.28; 438/758, 761

(56) References Cited

U.S. PATENT DOCUMENTS

| | | | |
|---|---|---|---|
| 4,369,105 A | * 1/1983 | Caldwell et al. | .......... 204/290 F |
| 4,831,003 A | * 5/1989 | Lang et al. | ................. 502/182 |
| 5,270,247 A | 12/1993 | Sakuma et al. | |

(List continued on next page.)

FOREIGN PATENT DOCUMENTS

| | | | |
|---|---|---|---|
| EP | 0 794 568 | 10/1997 | ......... H01L/21/768 |
| JP | 5-251339 | 9/1993 | |

OTHER PUBLICATIONS

U.S. application No. 09/927,230, Doan, filed Aug. 2001.
Suntola, "Surface Chemistry of Materials Deposition at Atomic Layer Level", Applied Surface Science, vol. 100/101, Mar. 1996, pp. 391–398.
Aarik et al, "Effect of Growth Conditions on Formation of TiO2–II Thin Films in Atomic Layer Deposition Process", Journal of Crystal Growth, vol. 181, Aug. 1997, pp. 259–264.
Skarp, "ALE–Reactor for Large Area Deposition", Applied Surface Science, vol. 112, Mar. 1997, pp. 251–254.
Kiyoko et al., Patent Abstract Application No. 04–024917 (JP 9224917, Sep. 1993),"Semiconductor Substrate and Its Manufacture."
Ritala, et al., "Atomic Layer Epitaxy—A Valuable Tool for Nanotechnology?" Nanotechnology, vol. 10, No. 1, pp. 19–24, Mar. 1999.
George, et al., "Surface Chemistry for Atomic Layer Growth", Journal of Physical Chemistry, vol. 100, No. 31, pp. 13121–13131, Aug. 1, 1996.
Suntola, "Atomic Layer Epitaxy", Handbook of Crystal Growth, vol. 3, Chapter 14, pp. 602–663, 1994.
Vernon, S.M., "Low–cost, high–efficiency solar cells utilizing GaAs–on–Si technology." Dialog Abstract of Report No. NREL/TP–451–5353; Apr. 1993.

(List continued on next page.)

*Primary Examiner*—Michael Barr
(74) *Attorney, Agent, or Firm*—Wells St. John P.S.

(57) ABSTRACT

A deposition method includes contacting a substrate with a first initiation precursor and forming a first portion of an initiation layer on the substrate. At least a part of the substrate is contacted with a second initiation precursor different from the first initiation precursor and a second portion of the initiation layer is formed on the substrate. The substrate may be simultaneously contacted with a plurality of initiation precursors, forming on the substrate and initiation layer comprising components derived from each of the plurality of initiation precursors. An initiation layer may be contacted with a deposition precursor, forming a deposition layer on the initiation layer. The deposition layer may be contacted with a second initiation precursor different from the first initiation precursor forming a second initiation layer over the substrate. Also, a first initiation layer may be formed substantially selectively on a first-type substrate surface relative to a second-type substrate surface and contacted with a deposition precursor, forming a deposition layer substantially selectively over the first-type substrate surface.

48 Claims, 3 Drawing Sheets

U.S. PATENT DOCUMENTS 5,480,818 A  *  1/1996  Matsumoto et al. .......... 437/40
5,916,365 A       6/1999  Sherman
6,083,832 A  *  7/2000  Sugai .......................... 438/672
6,174,377 B1     1/2001  Dowing et al.
6,203,613 B1 *  3/2001  Gates et al. ................. 117/104
6,270,572 B1 *  8/2001  Kim et al. .................... 117/93
6,287,965 B1 *  9/2001  Kang et al. ................. 438/648

OTHER PUBLICATIONS

U.S. application No. 09/643,004, Mercaldi, filed Aug. 21, 2000.

U.S. application No. 09/652,533, Sandhu et al., filed Aug. 31, 2000.

* cited by examiner

DEPOSITION METHODS

TECHNICAL FIELD

This invention relates to deposition methods including, but not limited to, atomic layer deposition.

BACKGROUND OF THE INVENTION

Atomic layer deposition (ALD) is recognized as a deposition technique that forms high quality materials with minimal defects and tight statistical process control. Even so, it is equally recognized that ALD can have limited application. In some circumstances, the theoretically expected quality of an ALD layer is not achieved.

It can be seen that a need exists for an ALD method that forms a layer without introducing intolerable defects into the material.

SUMMARY OF THE INVENTION

In accordance with an aspect of the invention, a deposition method includes contacting a substrate with a first initiation precursor and forming a first portion of an initiation layer on the substrate. At least a part of the substrate is contacted with a second initiation precursor different from the first initiation precursor and a second portion of the initiation layer is formed on the substrate. Another aspect of the invention includes simultaneously contacting a substrate with a plurality of initiation precursors, forming on the substrate an initiation layer comprising components derived from each of the plurality of initiation precursors. Also, in another aspect, a deposition method includes contacting a substrate with a first initiation precursor and forming a first initiation layer on the substrate. The first initiation layer is contacted with a deposition precursor and a deposition layer is formed on the first initiation layer. Next, at least the deposition layer is contacted with a second initiation precursor different from the first initiation precursor and a second initiation layer is formed over the substrate. In another aspect, a deposition method includes contacting a first-type surface of a substrate and a second-type surface of a substrate different from the first-type surface with a first initiation precursor and forming an initiation layer substantially selectively on the first-type surface relative to the second-type surface. The initiation layer is contacted with a deposition precursor and a deposition layer is formed substantially selectively over the first-type surface relative to the second-type surface.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Atomic layer deposition (ALD) involves formation of successive atomic layers on a substrate. Such layers may comprise an epitaxial, polycrystalline, amorphous, etc. material. ALD may also be referred to as atomic layer epitaxy, atomic layer processing, etc. Further, the invention may encompass other deposition methods not traditionally referred to as ALD, for example, chemical vapor deposition (CVD), but nevertheless including the method steps described herein. The deposition methods herein may be described in the context of formation on a semiconductor wafer. However, the invention encompasses deposition on a variety of substrates besides semiconductor substrates.

In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Described in summary, ALD includes exposing an initial substrate to a first chemical specie to accomplish chemisorption of the specie onto the substrate. Theoretically, the chemisorption forms a monolayer that is uniformly one atom or molecule thick on the entire exposed initial substrate. Practically, as further described below, chemisorption might not occur on all portions of the substrate. Nevertheless, such, an imperfect monolayer is still a monolayer in the context of this document. The first specie is purged from over the substrate and a second chemical specie is provided to chemisorb onto the first monolayer of the first specie. The second specie is then purged and the steps are repeated with exposure of the second specie monolayer to the first specie. In some cases, the two monolayers may be of the same specie. Also, additional species may be successively chemisorbed and purged just as described for the first and second species.

ALD is often described as a self-limiting process, in that a finite number of sites exist on a substrate to which the first specie may form chemical bonds. The second species might only bond to the first specie and thus may also be self-limiting. Once all of the finite number of sites on a substrate are bonded with a first specie, the first specie will often not bond to other of the first specie already bonded with the substrate. However, process conditions can be varied in ALD as discussed below to promote such bonding and render ALD not self-limiting. Accordingly, ALD may also encompass a specie forming other than one monolayer at a time by stacking of a specie, forming a layer more than one atom or molecule thick. The various aspects of the present invention described herein are applicable to any circumstance where ALD may be desired. A few examples of materials that may be deposited by ALD include silicon nitride, zirconium oxide, tantalum oxide, aluminum oxide, and others.

ALD offers a variety of advantages and improvements over other methods of forming materials on a substrate. However, ALD layers formed on a substrate may also possess thickness variations caused by in the composition and/or surface properties of the underlying substrate. Such disadvantage can limit the application of ALD methods to exclude applications where ALD might otherwise be particularly advantageous.

For example, when a material is to be deposited simultaneously over multiple types of substrates or over a single type of substrate having different surface properties, ALD may be a poor candidate for forming the material. Experience indicates that material formed by ALD may not form at a uniform rate on differing types of substrates or on a single type of substrate having multiple surface properties in multiple areas. The different rates of formation produce defects and/or varying thicknesses in the deposited material. Accordingly, even though ALD may be used to form very thin layers of material, thickness variations may produce unacceptable defects.

Figure 1:
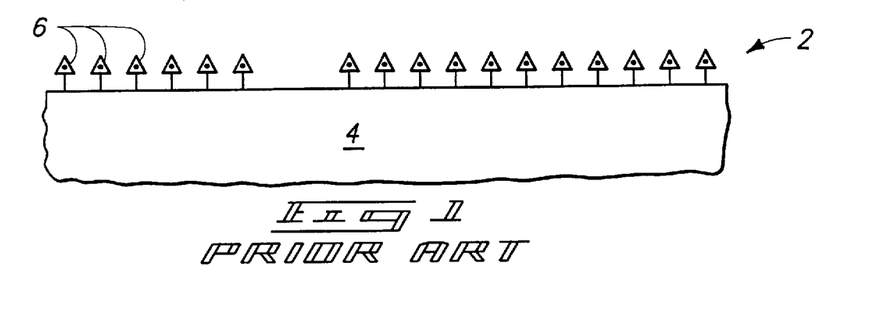
FIG. 1 is an enlarged sectional view of a wafer portion at one processing step in the prior art.

A deposition method according to one aspect of the invention comprises contacting a substrate with a first initiation precursor and forming a first portion of an initiation layer on the substrate. A wafer portion 2 is shown in FIG. 1, including a substrate 4. As indicated above, substrate 4 may comprise a variety of materials, including a semiconductive, conductive, insulative, or other material. A layer of a first initiation precursor 6 is formed on an outer surface of substrate 4 as a first portion of an initiation layer. The initiation layer may not be formed uniformly across substrate 4, as shown. Substrate 4 is exposed through an opening in the initiation layer. One problem among conventional deposition methods is that such openings in an initiation layer can result in defects or unevenness as successive layers are formed on the initiation layer.

Failure of the first initiation precursor 6 to form an initiation layer in certain regions may be caused by a variety of circumstances. For example, the amenability of a particular initiation precursor to form an initiation layer may depend on the type of substrate. Also, for example, even when the material from which a substrate is formed is substantially homogeneous, differences may exist in the type of surface provided with relation to the deposition method. Crystalline or other defects in a surface of a substrate may prevent a particular initiation precursor from forming an initiation layer uniformly across the substrate surface. It is further contemplated that yet other circumstances may prevent the formation of a uniform initiation layer on substrate 4.

Figure 2:
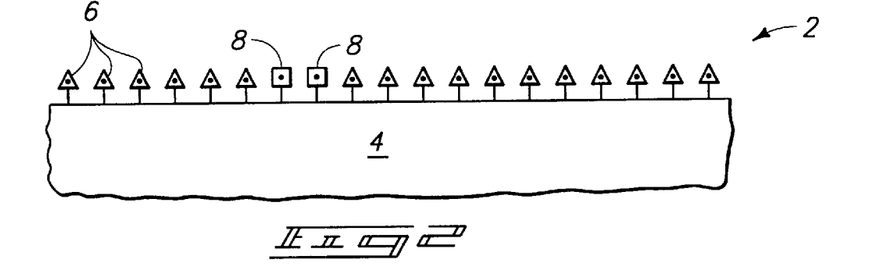
FIG. 2 is an enlarged sectional view of a wafer portion at one processing step in accordance with one aspect of the invention.

Accordingly, in one aspect of the present invention, at least a part of substrate 4 is contacted with a second initiation precursor different from the first initiation precursor, forming a second portion of the initiation layer on substrate 4. FIG. 2 shows wafer portion 2 wherein a second initiation precursor 8 forms a second portion of the initiation layer on the substrate. The second portion fills the opening in the first portion of the initiation layer where first initiation precursor 6 failed to form an initiation layer. The contacting of substrate 4 with first initiation precursor 6 and second initiation precursor 8 may occur separately or simultaneously. When contacting occurs separately, the initiation layer may form in two different portions, the second portion filling openings in the first portion. When contacting occurs simultaneously, the first and second portions of the initiation layer may also be formed simultaneously.

Figure 8:
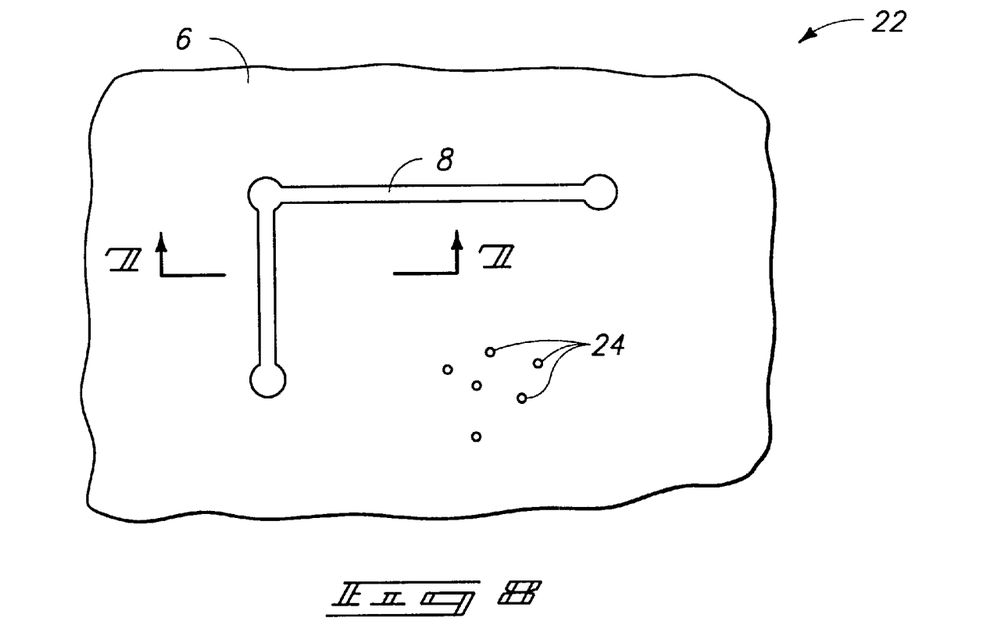
FIG. 8 is a top view of a portion of the FIG. 7 wafer.

It is conceivable that two or more initiation precursors may be desired to form an initiation layer having sufficient uniformity, Accordingly, another aspect of the invention involves simultaneously or otherwise contacting substrate 4 with a plurality of initiation precursors and forming on substrate 4 an initiation layer comprising components derived from each of the plurality of initiation precursors. The plurality of initiation precursors could include first initiation precursor 6 and second initiation precursor 8, as well as other initiation precursors. As described above, a portion of the initiation layer derived from one of the plurality of initiation precursors may form on the substrate in a region less susceptible to formation of the initiation layer by another of the plurality of initiation precursors. Such may be the case where the portion of the initiation layer derived from the one initiation precursor substantially fills pinholes 24 in the initiation layer formed by the another initiation precursor. Pinholes 24 are shown in FIG. 8 and discussed below.

One characteristic of CVD is the simultaneous presence of multiple precursors in the deposition chamber that react to form the deposited material. Such condition is contrasted with the purging criteria for traditional ALD where a single deposition precursor is contacted with a substrate and chemisorbs to the substrate or previously deposited precursor. The deposition process regime described herein may provide simultaneously present precursors of a type or under conditions such that chemisorption, rather than CVD reaction occurs. The plurality of initiation precursors do not react together as in CVD. Rather, they chemisorb to the substrate, providing a surface onto which a deposition precursor may next chemisorb to form a complete layer of desired material.

Figure 3:
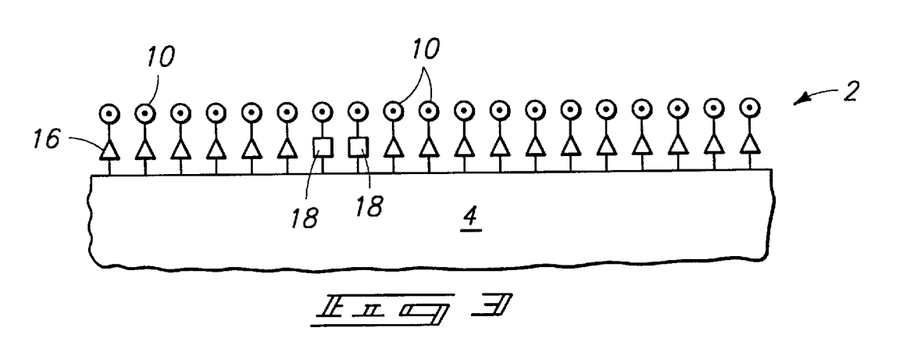
FIG. 3 is an enlarged sectional view of a portion of the FIG. 2 wafer at a processing step subsequent to that depicted by FIG. 2.
Figure 4:
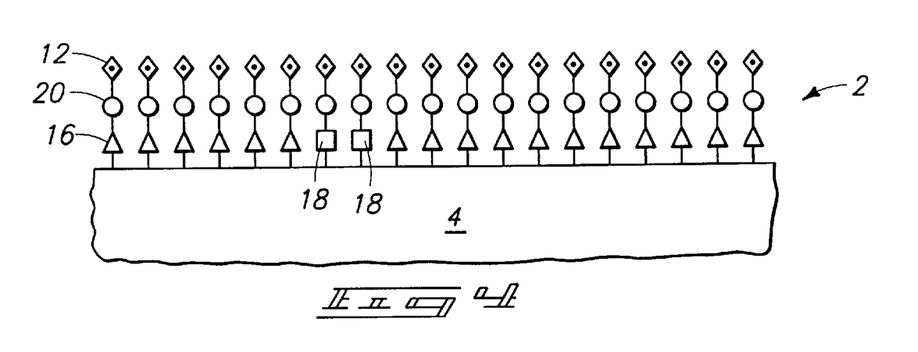
FIG. 4 is an enlarged sectional view of a portion of the FIG. 3 wafer at a processing step subsequent to that depicted by FIG. 3.

As shown in FIG. 3, the deposition method may further comprise contacting the first and second portions of the initiation layer with a deposition precursor 10 and forming a deposition layer on the first and second portions of the initiation layer. Accordingly, a deposition layer is formed on the portion of the initiation layer derived from first initiation precursor 6 and another portion of the initiation layer derived from second initiation precursor 8. A deposition method may additionally include contacting the deposition layer formed from deposition precursor 10 with a third initiation precursor 12 to form a second initiation layer, as shown in FIG. 4. Third initiation precursor 12 may be different from both first initiation precursor 6 and second initiation precursor 8. Alternatively, third initiation precursor 12 may be the same as either the first or second initiation precursors.

Another aspect of the invention includes a deposition method comprising contacting a substrate with first initiation precursor 6 and forming a first initiation precursor layer on substrate 4. The first initiation layer is contacted with deposition precursor 10, forming a deposition layer on the first initiation layer. At least the deposition layer is contacted with second initiation precursor 8, different from first initiation precursor 6, forming a second initiation layer over substrate 4.

Figure 5:
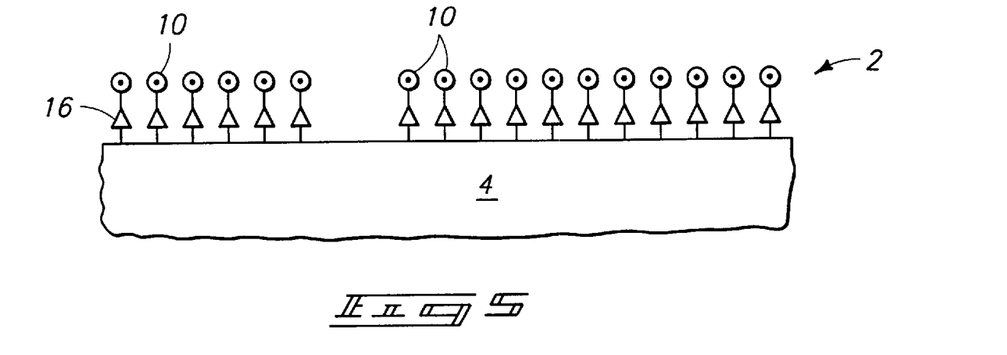
FIG. 5 is an enlarged sectional view of a wafer portion at one processing step in accordance with another aspect of the invention.

FIG. 5 shows substrate 4 having a first initiation layer derived from first initiation precursor 6 on which a deposition layer is formed from deposition precursor 10. Notably, deposition precursor 10 did not form a deposition layer uniformly across substrate 4 since the initiation layer was not formed uniformly across substrate 4. A second initiation precursor may be used to form a second initiation layer on the deposition layer. The invention thus contemplates using a second initiation precursor different from the first initiation precursor even though the second initiation precursor might not fill openings in the first initiation layer.

Figure 6:
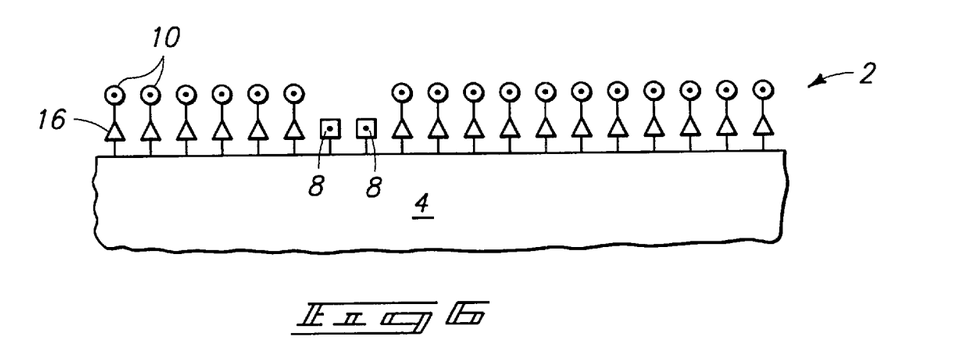
FIG. 6 is an enlarged sectional view of a portion of the FIG. 5 wafer at a processing step subsequent to that depicted by FIG. 5.

However, the invention also contemplates that the contacting with the second initiation precursor further comprises contacting a portion of substrate 4 on which the first initiation layer did not form and wherein forming the second initiation layer occurs on at least such portion. Accordingly, forming the second initiation layer could also occur on the portion of substrate 4 on which the first initiation layer did not form as well as on the deposition layer. FIG. 6 shows second initiation precursor forming a second initiation layer on the portion of substrate 4 on which the first initiation layer did not form. If second initiation precursor 8 also formed an initiation layer on the deposition layer, then the second initiation layer would exist over the first initiation layer, as well as comprise part of the first initiation layer.

In another aspect of the invention, at least the deposition layer of wafer portion 2 shown in FIG. 5 may be contacted with a plurality of initiation precursors. At least one of such plurality may be different from the first initiation precursor and the plurality may form a second initiation layer over the substrate. The contacting with the plurality of initiation precursors may further comprise contacting a portion of the substrate on which the first initiation layer did not form and the formation of the second initiation layer may occur on at least such portion. Also, the contacting with the plurality of initiation precursors may occur simultaneously or separately. Accordingly, one of the plurality of initiation precursors may comprise first initiation precursor 6, yet second initiation precursor 8 may be provided to form an initiation layer on a portion of substrate 4 where the first initiation layer did not form.

A variety of particular initiation precursors and deposition precursors may be used in a variety of combinations according to the aspects of the present invention. Trimethyl aluminum (TMA) is one of several possible deposition precursors. TMA may be used beneficially with $H_2O$, $H_2O_2$, $CH_3OH$, or other alcohols as initiation precursors. In keeping with the above description, selection of particular precursors will depend on the properties of a surface upon which such precursor is to form an initiation or deposition layer. For example, $H_2O$ may be used as a first initiation precursor to chemisorb on a silicon surface to form an initiation layer of —OH groups, producing hydrogen gas ($H_2$) as a byproduct. This is a self-limiting process, but it is contemplated that —OH groups might not form an initiation layer in select areas. Accordingly, $H_2O_2$, $CH_3OH$, or other alcohols may be used to form an initiation layer also having an —OH termination to which TMA will chemisorb as the deposition precursor.

The second initiation precursor different from the first initiation precursor may be contacted with the silicon surface simultaneously with the $H_2O$, separately from the $H_2O$, or after formation of the deposition layer. Contacting TMA with the —OH initiation layer will produce $CH_4$ as a byproduct when the hydrogen atoms of the —OH groups chemisorb with one or more methyl groups of the TMA, resulting in aluminum bonding to one or more oxygen atoms on the silicon surface. $H_2O$ may then be contacted with the deposition layer to form a second initiation layer. In the alternative, a third initiation precursor different from either the first or second initiation precursor may contact the deposition layer to form the second initiation layer. The TMA and $H_2O$ (or alternative second initiation precursors) deposition method may be used to form an aluminum oxide ($Al_2O_3$) film.

As shown in FIGS. 1–7 and 9, initiation and deposition precursors 6, 8, and 10 chemisorb with subsequent precursors to form first initiation compound 16, second initiation compound 18, and deposition compound 20, respectively. At least a portion of each precursor thus becomes a part of the final deposited material. For example, with $H_2O$ as an initiation precursor —OH forms on the silicon substrate as first initiation precursor 6 and —O— remains as first initiation compound 16 after chemisorption with a deposition precursor. Similarly, with TMA as a deposition precursor —Al(CH$_3$)$_2$ forms on the first initiation layer and remains as —Al— after chemisorption with a subsequent initiation precursor.

For an $Al_2O_3$ deposition from TMA/$H_2O$, and perhaps other depositions, chamber temperature may be from about 250 to about 350° C., preferably about 300° C., and chamber pressure may be from about 100 milliTorr to about 10 Torr, preferably about 200 milliTorr. Using a GENUS (TM) ALD tool, deposition of aluminum oxide from TMA and $H_2O$ may be achieved at a rate of about 0.84 Angstroms per cycle. The first step of the cycle may include pulsing about 1 Liter of $H_2O$ at about 20 Torr for from about 200 to about 300 microseconds ($\mu$sec). About 1 Liter of a carrier at about 20 Torr may be pulsed for from about 500 to about 1000 $\mu$sec to purge the $H_2O$. Next, about 1 Liter of TMA at about 20 Torr may be pulsed at for from about 100 to about 200 $\mu$sec followed by purging as indicated to complete the cycle. In keeping with the aspects of the present invention described herein, $H_2O_2$, $CH_3OH$, or other alcohols may be used in the above method as second initiation precursors to reduce defect formation.

Other types of film may be formed using deposition methods as disclosed herein. When $SiH_4$ or $SiCl_4$ are to be used as initiation precursors, alternate precursors include chlorosilanes ($SiHCl_3$, $SiH_2Cl_2$, and $SiH_3Cl$) and methysilanes (such as $Si(CH_3)_nH_{4-n}$, wherein n=1 to 4). It is also contemplated that other alternatives to initiation precursors exist that may be used, depending on the corresponding deposition precursors and surface properties of a substrate.

Figure 7:
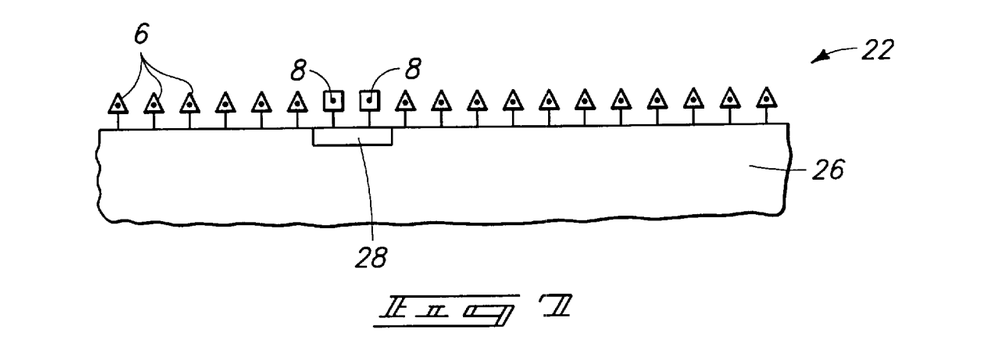
FIG. 7 is an enlarged sectional view of a wafer portion at one processing step in accordance with another aspect of the invention.

Turning to FIG. 7, a wafer portion 20 is shown having a first substrate region 26 and a second substrate region 28. Each substrate region has a property causing a difference between the susceptibility of the first and second regions to formation of an initiation layer by a first initiation precursor. Accordingly, contacting first region 26 and second region 28 with first initiation precursor 6 forms an initiation layer on first region 26. Contacting at least a part of the substrate, including second substrate region 28, with second initiation precursor 8 forms an initiation layer on second region 28.

Second substrate region 28 may result from a defect in or contamination of an otherwise homogeneous substrate, causing the difference in susceptibility to formation of an initiation layer by first initiation precursor 6. Such difference may also be the product of two different materials forming each substrate region, such as borophosphosilicate glass (BPSG) and polysilicon. Accordingly, it may even be the case that either the first or second region is insulative and the other is conductive. Accordingly, a first portion of the first initiation layer may form on an insulative portion of a substrate, such as first substrate region 26. A second portion of the first initiation layer may form on a conductive portion of a substrate, such as second substrate region 28.

In FIG. 8, a top view of wafer portion 20 of FIG. 7 shows a layer of first initiation precursor 6 that is continuous across the substrate surface and a layer of second initiation precursor 8 that is also continuous across the surface of the substrate. FIG. 8 also shows pinholes 24 in the layer of first initiation precursor 6 wherein no initiation layer was formed. Such pinholes are shown to not be continuous, since at least one pinhole exists that is not connected to a second pinhole by a region wherein no initiation layer was formed.

According to one aspect of the invention, substantially all of the first portion of the initiation layer may be continuous and at least some of a second portion of the initiation layer is not continuous. Such a result is produced when substantially all of first region 26 is continuous and another region exists wherein pinholes 24 are formed in the initiation layer over second region 28. Such a region may also exist when second region 28 is intentionally not continuous.

Another aspect of the invention similarly includes first initiation precursor 6 forming a negligible, if any, amount of an initiation layer on second region 28. In keeping with the present invention, second region 28 may comprise a variety of materials, including those intended to form a designated pattern such as shown in FIG. 8 and different from the material comprising first substrate region 26. The deposition methods of the present invention may be helpful in forming such patterned areas by contacting a first-type surface of a substrate and a second-type surface of a substrate different from the first-type surface with a first initiation precursor and forming a first initiation layer substantially selectively on the first-type surface relative to the second-type surface. The initiation layer may then be contacted with a deposition precursor and a deposition layer formed substantially selectively over the first-type surface relative to the second-type surface.

Generally, substantially selective deposition is most desirable when substantially all of the first-type surface is continuous and substantially all of the second-type surface is also continuous. When multiple types of continuous surfaces are provided within a substrate, yet deposition is only desired on one such surface, such a method may be useful. According to the present invention, the first-type surface may even have a common border with the second-type surface. In the various types of arrangements of the first-type and second-type surfaces described above, it is desirable that the first initiation precursor form a negligible, if any, amount of the initiation layer on the second-type surface, surpassing mere substantial selectivity.

Figure 9:
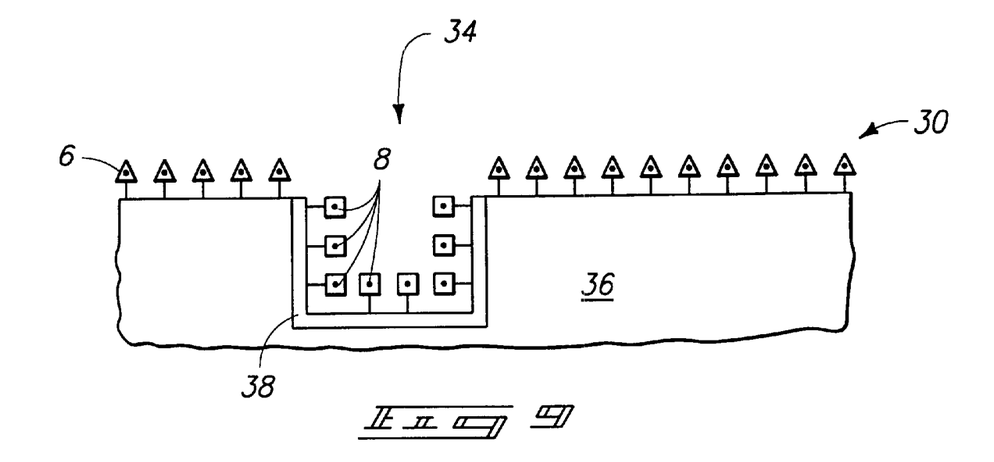
FIG. 9 is an enlarged sectional view of a wafer portion at one processing step in accordance with another aspect of the invention.

Turning to FIG. 9, a wafer portion 30 is shown having a recess 34 formed therein. Wafer portion 30 further comprises an insulation material 36 and a conductive material 38, formed in recess 34. In this regard, wafer portion 30 could exemplify a wafer portion having a BPSG layer and a container opening formed therein for a container capacitor conductive material 38 may comprise a storage node within the container opening. Such a conductive material may comprise polysilicon. As exemplified by FIG. 9, a first initiation precursor 6 may form an initiation layer on insulative material 36 without forming an initiation layer on conductive material 38, and vice versa. A deposition precursor may then form a deposition layer substantially selectively over insulative material 36. Alternatively, second initiation precursor 8 may form a second portion of the initiation layer on conductive material 38 when such is desired.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A deposition method comprising:
    contacting a substrate with a first initiation precursor and forming a first portion of an initiation layer on the substrate; and
    contacting at least a part of the substrate with a second initiation precursor different from the first initiation precursor and forming a second portion of the initiation layer on the substrate in a region less susceptible to formation of the first portion of the initiation layer than to formation of the second portion.

2. The deposition method of claim 1, wherein the initiation layer consists essentially of a monolayer of the first and second initiation precursors.

3. The deposition method of claim 1, wherein the contacting with the first initiation precursor and the contacting with the second initiation precursor occur simultaneously.

4. The deposition method of claim 1, wherein substantially all of the first portion of the initiation layer is continuous and at least some of the second portion of the initiation layer is not continuous.

5. The deposition method of claim 1, wherein the second portion of the initiation layer does not form over the first portion of the initiation layer.

6. The deposition method of claim 1, wherein the first portion of the initiation layer forms on an insulative portion of the substrate and the second portion of the initiation layer forms on a conductive portion of the substrate.

7. The deposition method of claim 1, wherein the forming the second portion of the initiation layer substantially fills holes in the first portion of the initiation layer.

8. The deposition method of claim 1, further comprising contacting the first and second portions of the initiation layer with a deposition precursor and forming a deposition layer on the first and second portions of the initiation layer.

9. The deposition method of claim 8, further comprising contacting the deposition layer with a third initiation precursor different from both the first and second initiation precursor and forming a second initiation layer on the deposition layer.

10. A deposition method comprising:
    simultaneously contacting a substrate with a plurality of initiation precursors; and
    chemisorbing on the substrate an initiation layer comprising components derived from each of the plurality of initiation precursors, the initiation layer consisting essentially of a monolayer.

11. The deposition method of claim 10, wherein the initiation layer consists of a monolayer.

12. The deposition method of claim 10, wherein a portion of the initiation layer derived from one of the plurality of initiation precursors forms on the substrate in a region less susceptible to formation of the initiation layer by another of the plurality of initiation precursors.

13. The deposition method of claim 12, wherein the portion of the initiation layer derived from the one initiation precursor substantially fills holes in the initiation layer formed by the another initiation precursor.

14. The deposition method of claim 10, further comprising contacting the initiation layer with a deposition precursor and forming a deposition layer on one portion of the initiation layer derived from one initiation precursor and on another portion of the initiation layer derived from another initiation precursor.

15. A deposition method comprising:
providing a substrate having a first region and second region, the first and second regions each having a property causing a difference between the susceptibility of the first and second regions to formation of an initiation layer by a first initiation precursor;
contacting the substrate with the first initiation precursor and forming the initiation layer on the first region; and
contacting at least a part of the substrate with a second initiation precursor and forming the initiation layer on the second region, but not over the first region.

16. The deposition method of claim 15, wherein the initiation layer consists essentially of a monolayer on the first and second region.

17. The deposition method of claim 15, wherein the first initiation precursor forms a negligible, if any, amount of the initiation layer on the second region.

18. The deposition method of claim 15, wherein the contacting with the first initiation precursor and the contacting with the second initiation precursor occur simultaneously.

19. The deposition method of claim 15, wherein substantially all of the first region is continuous and at least some of the second region is not continuous.

20. The deposition method of claim 15, wherein either the first or the second region is insulative and the other is conductive.

21. The deposition method of claim 15, wherein the forming the initiation layer on the second region substantially fills holes in the initiation layer on the first region.

22. The deposition method of claim 15, further comprising contacting the initiation layer on the first and second regions with a deposition precursor and forming a deposition layer on the initiation layer on the first and second regions.

23. The deposition method of claim 22, further comprising contacting the deposition layer with a third initiation precursor different from both the first and second initiation precursor and forming a second initiation layer on the deposition layer.

24. A deposition method comprising:
contacting a substrate with a first initiation precursor and forming a first initiation layer on the substrate;
contacting the first initiation layer with a deposition precursor different from the first initiation precursor and forming a deposition layer on the first initiation layer; and
contacting at least the deposition layer with a second initiation precursor different from the first initiation precursor and the deposition precursor, and forming a second initiation layer over the substrate.

25. The deposition method of claim 24, wherein the first initiation layer, deposition layer, and second initiation layer each consist essentially of a monolayer.

26. The deposition method of claim 24, wherein the contacting with the second initiation precursor further comprises contacting a portion of the substrate on which the first initiation layer did not form and wherein the forming the second initiation layer occurs on at least such portion.

27. The deposition method of claim 26, wherein the forming the second initiation layer substantially fills holes in the first initiation layer.

28. A deposition method comprising:
contacting a substrate with a first initiation precursor and forming a first initiation layer on the substrate;
contacting the first initiation layer with a deposition precursor different from the first initiation precursor and forming a deposition layer on the first initiation layer; and
contacting at least the deposition layer with a plurality of initiation precursors, at least one of which is different from the first initiation precursor and deposition precursor, and forming a second initiation layer over the substrate.

29. The deposition method of claim 28, wherein the first initiation layer, deposition layer, and second initiation layer each consist essentially of a monolayer.

30. The deposition method of claim 28, wherein one of the plurality of initiation precursors is the first initiation precursor.

31. The deposition method of claim 28, wherein the contacting with the plurality of initiation precursors occurs simultaneously.

32. The deposition method of claim 28, wherein the contacting with the plurality of initiation precursors further comprises contacting a portion of the substrate on which the first initiation layer did not form and wherein the forming the second initiation layer occurs on at least such portion.

33. The deposition method of claim 32, wherein the forming the second initiation layer substantially fills holes in the first initiation layer.

34. A deposition method comprising:
contacting a first-type surface of a substrate and a second-type surface of a substrate different from the first-type surface with a first initiation precursor and forming an initiation layer substantially selectively on the first-type surface relative to the second-type surface, the first-type surface being different from the second-type surface as to at least one of a surface property and a composition; and
contacting the initiation layer with a deposition precursor and forming a deposition layer substantially selectively over the first-type surface relative to the second-type surface.

35. The deposition method of claim 34, wherein the initiation layer and deposition layer each consist essentially of a monolayer.

36. The deposition method of claim 34, wherein substantially all of the first-type surface is continuous and at least some of the second-type surface is not continuous.

37. The deposition method of claim 34, wherein substantially all of the first-type surface is continuous and substantially all of the second-type surface is continuous.

38. The deposition method of claim 37, wherein the first-type surface has a common border with the second-type surface.

39. The deposition method of claim 34, wherein either the first-or the second-type surface is insulative and the other is conductive.

40. The deposition method of claim 34, wherein the first initiation precursor forms a negligible, if any, amount of the initiation layer on the second-type surface.

41. A deposition method comprising:
contacting a first-type surface of a substrate and a second-type surface of the substrate different from the first-type surface with a first initiation precursor forming an initiation layer substantially selectively on the first-type surface relative to the second-type surface, the substantially selective forming leaving holes in the initiation layer and the first-type surface being different from the second-type surface as to at least one of a surface property and a composition;

contacting the second-type surface with a second initiation precursor and forming the initiation layer on the second-type surface but not over the first-type surface, the forming the initiation layer on the second-type surface substantially filling the holes in the initiation layer; and contacting the initiation layer on the first-type surface and the second-type surface with a deposition precursor and forming a deposition layer over the first-type surface and the second-type surface.

42. The deposition method of claim 41, wherein the initiation layer and deposition layer each consist essentially of a monolayer.

43. The deposition method of claim 41, wherein the first initiation precursor forms a negligible, if any, amount of the initiation layer on the second-type surface.

44. The deposition method of claim 41, wherein the contacting with the first initiation precursor and the contacting with the second initiation precursor occur simultaneously.

45. The deposition method of claim 41, wherein substantially all of the first-type surface is continuous.

46. The deposition method of claim 41, wherein either the first-or the second-type surface is insulative and the other is conductive.

47. The deposition method of claim 41, wherein the contacting with the first initiation precursor and with the second initiation precursor occur separately.

48. The deposition method of claim 41, further comprising contacting the deposition layer with a third initiation precursor different from both the first and second initiation precursor and forming a second initiation layer on the deposition layer.

* * * * *

UNITED STATES PATENT AND TRADEMARK OFFICE
CERTIFICATE OF CORRECTION

PATENT NO.    : 6,458,416 B1
DATED         : October 1, 2002
INVENTOR(S)   : Garo J. Derderian et al.

It is certified that error appears in the above-identified patent and that said Letters Patent is hereby corrected as shown below:

<u>Column 3,</u>
Line 13, replace "by in" with -- by variations in --.

<u>Column 5,</u>
Line 18, after the word "precursor" add the number -- 8 --

Signed and Sealed this

Seventeenth Day of June, 2003

JAMES E. ROGAN
*Director of the United States Patent and Trademark Office*